(12) United States Patent
Meunier et al.

(10) Patent No.: US 6,261,421 B1
(45) Date of Patent: Jul. 17, 2001

(54) PARTICLE-FREE CATHODIC ARC CARBON ION SOURCE

(75) Inventors: Jean-Luc Meunier, Montreal (CA); Munther Kandah, Irbid (JO)

(73) Assignee: McGill University, Montreal (CA)

(*) Notice: Subject to any disclaimer, the term of this patent is extended or adjusted under 35 U.S.C. 154(b) by 0 days.

(21) Appl. No.: 09/467,908

(22) Filed: Dec. 21, 1999

(30) Foreign Application Priority Data

Dec. 22, 1998 (CA) .................................................. 2256847

(51) Int. Cl.⁷ .................................................. B01J 19/08
(52) U.S. Cl. .............. 204/173; 204/192.38; 204/298.41; 427/580; 427/122; 422/186.21
(58) Field of Search .............. 204/173, 192.38, 204/298.41; 427/580, 122

(56) References Cited

U.S. PATENT DOCUMENTS

| | | | | |
|---|---|---|---|---|
| 5,401,543 | * | 3/1995 | O'Neil et al. | 427/580 |
| 5,643,343 | * | 7/1997 | Selifanov et al. | 51/306 |
| 5,858,477 | * | 1/1999 | Veerasamy et al. | 427/562 |
| 6,031,239 | * | 2/2000 | Shi et al. | 250/492.1 |
| 6,103,305 | * | 8/2000 | Friedman et al. | 427/249.7 |
| 6,139,964 | * | 10/2000 | Sathrum et al. | 428/408 |

* cited by examiner

Primary Examiner—Kishor Mayekar
(74) Attorney, Agent, or Firm—Swabey Ogilvy Renault

(57) ABSTRACT

A method and apparatus for vacuum arc deposition of carbon on a substrate inhibits or eliminates emission of contaminating carbon particles in the ion plasma by maintaining an elevated local plasma pressure at the cathode or target surface, thereby minimizing the role of heat conduction in the creation of the particles and strongly increasing the electron emission cooling effects.

12 Claims, 5 Drawing Sheets

PARTICLE-FREE CATHODIC ARC CARBON ION SOURCE

BACKGROUND OF THE INVENTION i) Field of the Invention

This invention relates to a method and apparatus for vacuum arc deposition of carbon on a substrate; more especially it relates to cathodic arc carbon ion sources typically used in Arc Ion Plating (AIP) devices, to produce diamondlike protective coatings.

ii) Description of Prior Art

Cathodic arc carbon ion sources are typically used in Arc Ion Plating (AIP) devices to produce diamondlike protective coatings. Diamondlike refers to an amorphous form of carbon with properties similar to diamond protective coatings. In AIP devices, an electric arc burning in a vacuum on a graphite cathode generates very small hot spots called "cathode spots", these spots being the site of a strong plasma flux which is directed towards the surface of a substrate to be coated. In addition to the carbon ions present in the plasma flux, these sources also generate small graphite particles typically 0.1–10 $\mu$m in diameter, which are deposited with the amorphous carbon film, thereby strongly degrading the coating properties. The small graphite particles are typically formed as a spray of liquid droplets and chunks or irregular non-sperical particles of graphite emitted through thermal shock effects. Preventing these particles from reaching the substrate to be coated is necessary.

Present solutions use various types of filters to eliminate the particle flux between the source and the substrate to be coated. Such filters modify the path of the plasma flux beam, for example, by setting a non-linear or curved ion path by the use of magnetic and/or electric fields. Most particles do not follow the curved path and are collected on the side walls of the vacuum chamber leaving a relatively clean beam arriving at the substrate. Shortcomings of the filters are:

a) a decrease in the output plasma flux and hence in deposition rate and system efficiency;

b) a decrease in the area covered by the beam resulting in smaller surface areas being coated in a given time interval;

c) such systems add to the complexity of the source by imposing a particular source geometry and more importantly an added control of the magnetic/electric field parameters within the filter to be adjusted to the arc source parameters;

d) particles produced by the arc source accumulate in the filter and potentially affect the filter efficiency while imposing shutdown for maintenance in industrial operations; and e) a portion of the particle flux may still escape into the coating chamber.

The AIP coating systems are currently and widely used industrially, for example, to produce the gold colored titanium nitride films in medical implants, in the automotive industry, decorative industry, and for more resistant cutting tools. In such systems, particles are emitted typically in a smaller quantity compared to carbon sources and the resulting coating degradation has generally been considered not detrimental for most applications. Simple multi-source coating chambers are generally being used industrially to produce these coatings. In an industrial environment, the complexity of the filtered source geometry strongly restrains the transfer from a multi-source AIP chamber device to the deposition of diamondlike. A specific deposition setup is needed for diamondlike, while the multi-source deposition chambers can accommodate various types of coatings by changing the cathode material in the source.

SUMMARY

It is an object of this invention to provide a method and apparatus for vacuum arc deposition of carbon on a substrate; more especially the invention is concerned with such a method and apparatus in which development of the contaminating particles of carbon is inhibited.

In accordance with one aspect of the invention there is provided a method for vacuum arc deposition of carbon on a substrate comprising: establishing an electric arc between an anode and a cathode in a chamber under vacuum, said cathode having a target surface of non-porous graphite; emitting a plasma of carbon ions from said target surface; depositing said carbon ions on a substrate as an amorphous carbon coating and maintaining an elevated local plasma pressure at said target surface effective to minimize the role of heat conduction in said target surface and formation of liquid droplets of carbon, and to promote the electron emission (Nottingham) cooling effects.

In accordance with another aspect of the invention there is provided an apparatus for vacuum arc deposition of carbon on a substrate comprising: a chamber, vacuum means adapted to establish a vacuum in said chamber, a cathode and an anode in spaced apart relationship and means to establish an electric arc between said cathode and said anode, said cathode having a target surface of non-porous graphite; means for supporting a substrate in said chamber for deposition of carbon ions from a plasma developed at said target surface by said electric arc, and means for maintaining an elevated local plasma pressure at said target surface effective to inhibit the formation of liquid droplets of carbon, or limit heat conduction effects.

In accordance with the invention the plasma of carbon ions may be directed along a linear path to the substrate surface and no filters are required to change the path of the plasma, for separation of contaminating carbon particles.

In another aspect of the invention, the method described herein may be adapted to vacuum arc deposition of metal on a substrate by employing a target surface of metal instead of graphite.

DETAILED DESCRIPTION OF THE INVENTION

In accordance with the invention the emission of carbon particles is eliminated or inhibited directly at the site of conventional production, i.e., the cathode spots. In other words, the cathode spot emission properties are optimized to enhance the ion flux intensity and energy while simultaneously eliminating the emission of the micro-droplets which form the particles. The chunks of irregular non-spherical graphite particles are also eliminated. Elimination of the particle emission directly at their source means a filtering system is no longer needed, yielding a linear path between the source and the surface to be coated in a manner similar to the usual non-filtered sources used in industry for titanium nitride and other advanced ceramic films. Elimination of the micro-droplet emissions is achieved by maintaining an elevated local plasma pressure at the cathode or target surface so as to decrease the contribution of conduction heat transfer and increase the cooling effects from electron emission in the cathode spots at the target surface, thereby inhibiting the formation of liquid volumes within the spot.

It has been found by theory that within the cathode spot, heat supplied by conduction to the carbon cathode material, which heat supply is responsible for melting and production of liquid droplets, decrease with increase in local spot pressure. An increase in the local spot pressure has also been found by theory to increase the surface cooling mechanisms through an increase of the electron emission, this being referred to in the literature as Nottingham cooling.

Thus in accordance with the invention the local heat load on the cathode surface is reduced by increasing the local plasma pressure in the cathode spot volume. This increases the mobility of the cathode spot. The "local" pressure refers to the plasma pressure in the micrometer size cathode spot area, and not to the pressure in the vacuum chamber where the arc is developed, which latter pressure remains low.

Three different means have been developed to increase the local plasma pressure in the cathode spots and in preferred embodiments of the invention the method and apparatus exploit all three means.

First, higher graphite arc cathode spot mobility is found to be significant in achieving high local plasma pressure and low local heat flux. A magnetic field lines geometry generated from the back of the cathode surface brings the electric arc into rotation at a radial position corresponding to the zero field component in a direction perpendicular to the cathode surface, the cathode spot rotation being driven by the intensity of the magnetic field component parallel to the cathode surface at this radial position.

In particular a first magnetic field is applied to bring the electric arc cathode spots into rotation at a radial position corresponding to a zero field component in a direction perpendicular to said target surface.

The first magnetic field is developed by a first magnetic field means disposed adjacent the cathode, such that the cathode is disposed intermediate the anode and such first magnetic field means, and intermediate the substrate and the first magnetic field means.

Secondly the graphite target surface has a morphology optimized to yield an arc mobility similar to that of metals. More especially the target surface is of non-porous graphite, for example, Pyroid graphite or PGCS-1 graphite. Pyroid graphite is produced by Specialty Minerals Inc., U.S.A. and PGCS-1 graphite is produced by POCO Graphite Inc., U.S.A.

Concerning the morphology of the graphite a combination of properties favor a high velocity of the cathode spot and low macro-particles emission. The properties analyzed to optimize the cathode morphology were the porosity (through the mean pore size in the material), the density of the material, the grain size and the electrical resistivity (giving similarly the thermal conductivity characteristics). In terms of relative values of each properties, optimum materials have:

low pore size
high density
large grain size
low electrical resistivity (high thermal conductivity).

However, no single property can dictate the best material. The respective values for the materials in FIG. 4 are given in the following Table.

|  | Graphite Material | Grain Size ($\mu$m) | Pore Size ($\mu$m) | Density g/cm$^3$ | El.resistivity ($\mu\Omega \cdot$ cm) |
|---|---|---|---|---|---|
| Best | PYROID[1] | — | 0 | 2.2 | 250 (II) |
|  |  | $\infty$ |  |  | 3 × 10$^5$ ($\perp$) |
| ↓ | PGCS-1[2] | 15 | 3 | 1.79 | 1500 |
| ↓ | ZXF-5Q[2] | 1 | 0.2 | 1.8 | 1650 |
| Worst | PS[2] | 5 | 1.2 | 1.33 | 2900 |

(II) = in a direction parallel to the surface;
($\perp$) = in a direction perpendicular to the surface, Materials named correspond to the manufacturers description
1= Specialty Minerals Inc., U.S.A.
2= POCO Graphite Inc., U.S.A.

A material is preferred that simulates as much as possible metallic materials, i.e., low electrical resistivity, high density and no porosity to anchor the arc root. This is an opposite goal and method compared to previous attempts (see, for example, the Patent # WO 98/03988 "Cathode Arc Source and Graphite Target"). These previous techniques use porous graphite sources so that the arc remains almost stationary (or with very low velocity) to produce surface temperatures high enough for "thermionic" (thermally induced) electron emission. On the contrary, in the present invention, the arc is forced towards the "thermo-field" type of electron emission that is characteristic of cold electrodes.

From the results of FIG. 4 PYROID graphite simulates best a metallic type of behavior with its very small parallel electrical resistivity, absence of porosity to anchor the cathode spot, and very high density. The second material, however, PGCS-1, is practically as good as PYROID even though it is made through a more conventional technique (hence it shows a much smaller price). The techniques used by the manufacturers to produce these graphite materials is described below, as given by the manufacturer.

All graphite materials except "PYROID" are made using the following conventional technique: the raw graphite material produced through calcination of petroleum coke is crushed into powders of given size distribution, mixed with a binder, compressed and fired at high temperature to remove volatiles and provide homogeneity. This produces the various polycrystalline materials, the best in this category being PGCS-1 for the present application.

PYROID is a pyrolytic graphite made in a high temperature vacuum furnace by chemical vapor deposition (CVD) from a hydrocarbon gas. It is substrate nucleated, with the advantage of virtually no porosity. The basal plane of the graphite structure is oriented parallel to the substrate surface, resulting in a low electrical resistivity and high thermal conductivity in this direction (i.e. direction parallel to the 2-dimensional hexagonal structure of graphite). This material hence exhibits maximum orientation and anisotropy. In the direction parallel to the source surface, this material thus approaches the properties of metallic materials.

The choice of graphite material together with induced arc mobility strongly decrease the emission of particles but do not eliminate it completely. Elimination is obtained by further increasing the local plasma pressure at the cathode surface with the use of a second confining magnetic field. This second magnetic field is typically generated by a coil surrounding the emissive surface of the target surface, it produces a field component perpendicular to the target surface that is a maximum at the target surface and decreases to zero with increasing distance from the surface. The second field has the effect of decreasing the losses of plasma along the first magnetic field lines geometry, confining the carbon plasma in the area of the cathode spots, hence increasing the local plasma pressure.

In particular a second magnetic field means develops the second magnetic field and is disposed radially outwardly of the target surface.

Thus existing solution use filters to eliminate particles emitted from standard types of arcing devices. The present invention eliminates the filters by optimizing the emission characteristics of the arcing device itself. Based on theoretical and experimental knowledge of electrical arc—surface interaction phenomena, a particular choice of graphite material morphology is made. This morphology along with proper first magnetic field intensity and orientation enables cathode spot mobility in a way similar to metallic cathode surfaces. Such mobility of the arc root on graphite is new in itself, the arc usually showing very long residence times on local sites of the electrode. The second confining field further prohibits the radial escape of the cathode spot plasma and increases the local plasma pressure in such a way as to modify the operating mode of the arc spot. The arc spot becomes very stable showing smooth movement over the electrode surface, increased ion energy and ion flux while eliminating the micro-droplets emission. A shift in the emission characteristics of the spot towards the useful portion of the flux is achieved with the added advantage of obtaining ion energies that lie in a better range for diamond-like film formation, typically around 50 eV as shown in Table 1 below. In normal devices, the deposition energy is normally adjusted through an induced voltage bias applied to the surface to be coated. The ability of producing a flux with the required energy and possibly to control this energy at the source possibly eliminates the need of substrate biasing, and facilitates the applicability of the technique to non-electrically conducting surfaces.

TABLE 1

Ion Energy Analyzer (IEA) Results

| Cathode type | BH (Tesla) | $kT_i$ (eV) | $kT_e$ (eV) | $n_i = n_e$ (m$^{-3}$) | $I_{io}$ (A) | $I_{eo}$ (A) |
|---|---|---|---|---|---|---|
| PYROID | 0.14 | 62.6 | 12.75 | $5.75 \times 10^{14}$ | $4.0 \times 10^{-6}$ | $8.5 \times 10^{-6}$ |
| ZXF-5Q | 0.14 | 52.1 | 9.25 | $1.05 \times 10^{14}$ | $2.6 \times 10^{-6}$ | $4.2 \times 10^{-6}$ |
| ZXF-5Q | 0 | 39.8 | 5.99 | $8.54 \times 10^{12}$ | $1.6 \times 10^{-6}$ | $2.5 \times 10^{-6}$ |

DESCRIPTION OF PREFERRED EMBODIMENTS WITH REFERENCE TO DRAWINGS

Figure 1:
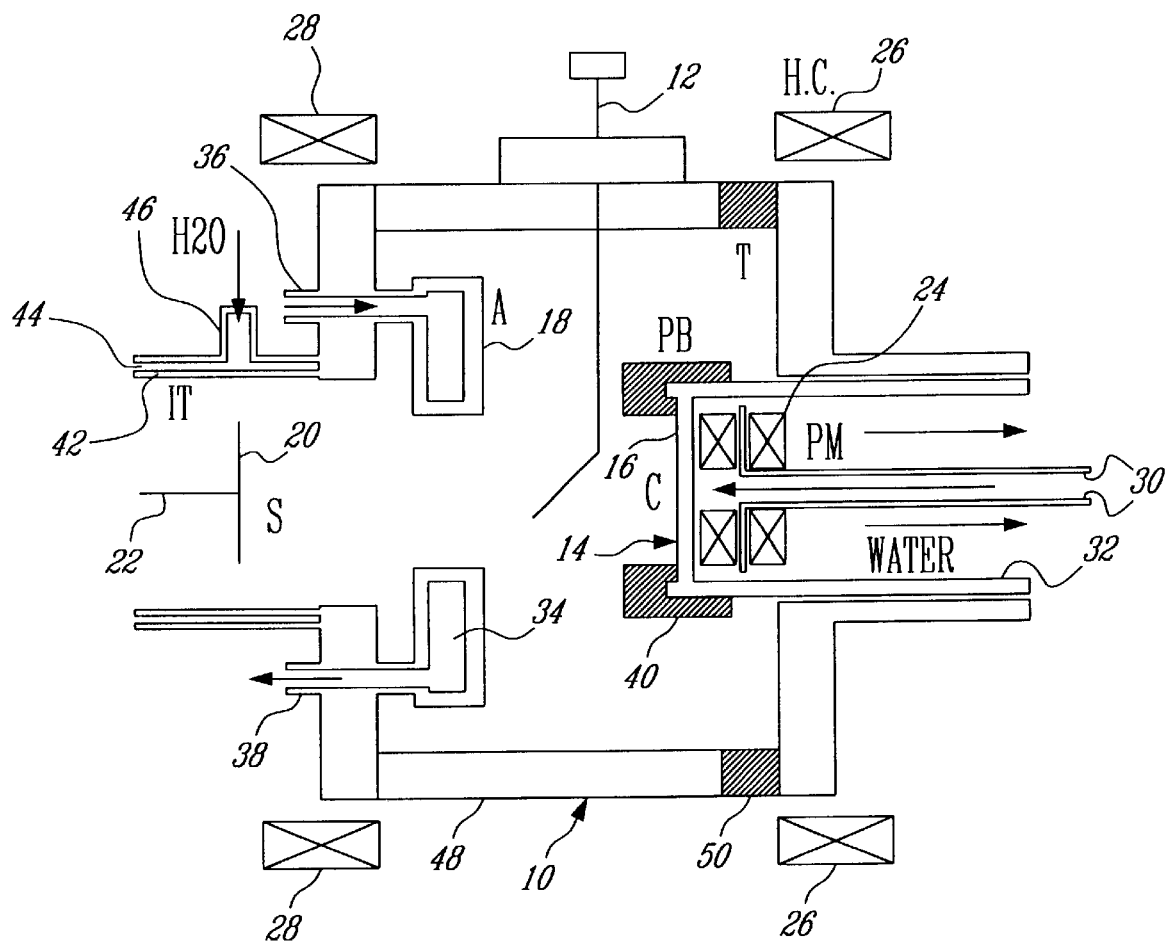
FIG. 1 illustrates schematically an apparatus of the invention for carrying out the method of the invention.

With further reference to FIG. 1 a vacuum chamber 10 is connected to a source of vacuum (not shown). An arc igniter 12 is mounted in chamber 10.

A graphite cathode 14 having a target surface 16 and a generally annular anode 18 are mounted in chamber 10. A substrate 20 to be coated is supported by a holder 22 in opposed facing relationship with target surface 16.

Permanent magnets 24 are disposed behind cathode 14 and Helmholz coils 26 and 28 are disposed radially outwardly of chamber 10.

Cathode 14 is water cooled by water flow along an inner conduit 30 and an outer conduit 32.

Anode 18 is water cooled by water flow along an annular conduit 34 having an inlet conduit 36 and an outlet conduit 38.

Cathode 14 is mounted in an insulating casing 40 which defines a passive border.

Cathode 14 and anode 18 are connected to an arc power supply (not shown).

The tubular wall 42 around substrate 20 may also be water cooled by a flow passage 44 having an inlet 46.

The wall 48 of chamber 10 may include insulation 50, such as Teflon (Trade-mark).

Figure 2:
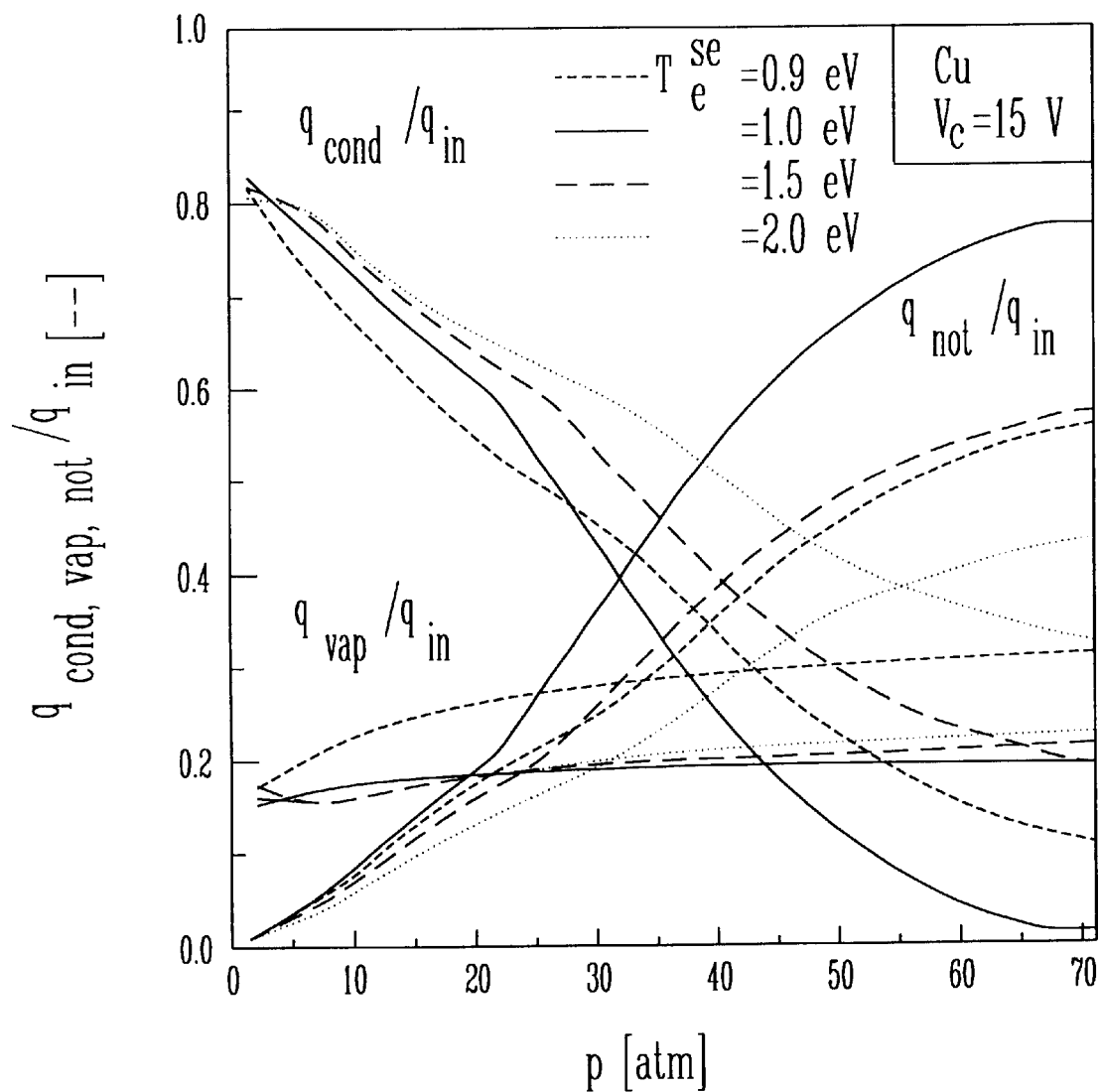
FIG. 2 illustrates graphically variations of heat losses by conduction from the cathode spots with local plasma pressure.

With further reference to FIG. 2, there is shown the distribution of different heat losses from the cathode hot spot surface as a function of local cathode spot plasma pressure p for a metallic electrode (Cu) and cathode voltage fall $V_c = 15V$ and electron temperature at the edge of the sheath between $0.9 < T^{se} < 2.0$ eV.

The contribution to heat losses from the cathode spot is calculated using the physical model of the spot plasma/surface interaction of Coulombe & Meunier (1997). The conduction heat flux $q_{cond}$ is responsible for melting of the cathode material and droplet production. It was shown that the Nottingham cooling effect ($q_{not}$) induced by electron emission becomes predominant at higher cathode spot pressure, at the expense of decreasing the conduction flux in the surface. A shift towards higher operating cathode spot pressure decreases or eliminates the production of droplets by the source.

Figure 3:
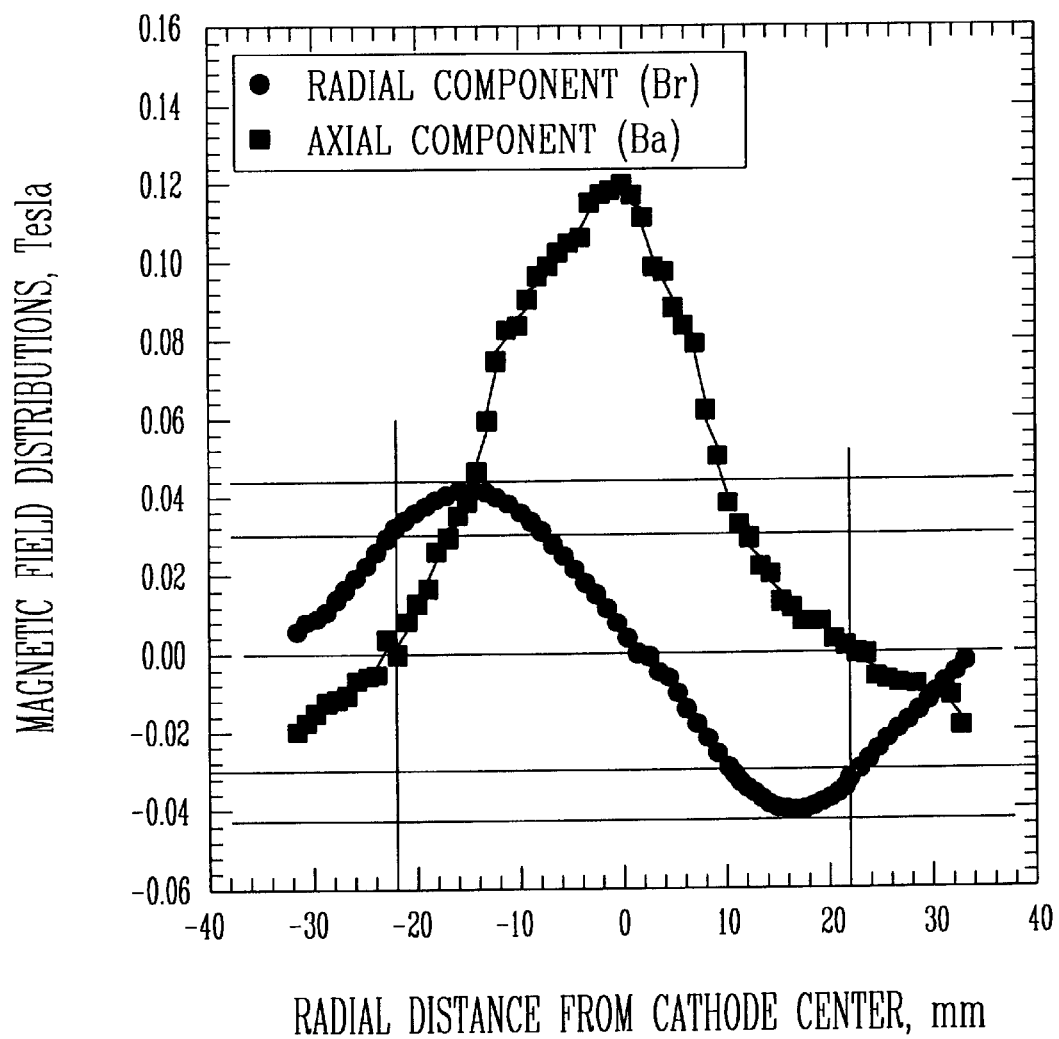
FIG. 3 demonstrates graphically the bringing of the electric arc into rotation at some radial position employing both magnetic field means.

With further reference to FIG. 3 there is shown radial and axial magnetic field distributions induced by permanent magnets arranged in the presence of Helmholtz field over the cathode surface.

Axial ($\perp$ to cathode surface) and radial ($\parallel$ to cathode surface) components of magnetic field arc induced from behind the cathode. The position of the arc rotation is defined by the zero axial field intensity (at 22 mm radius in the graph) and the arc velocity is controlled by the radial field component at this position. A series of permanent magnets were used for simplicity, these can be replaced by magnetic field coils in a geometry that will optimize the use of a wider surface of the cathode.

Figure 4:
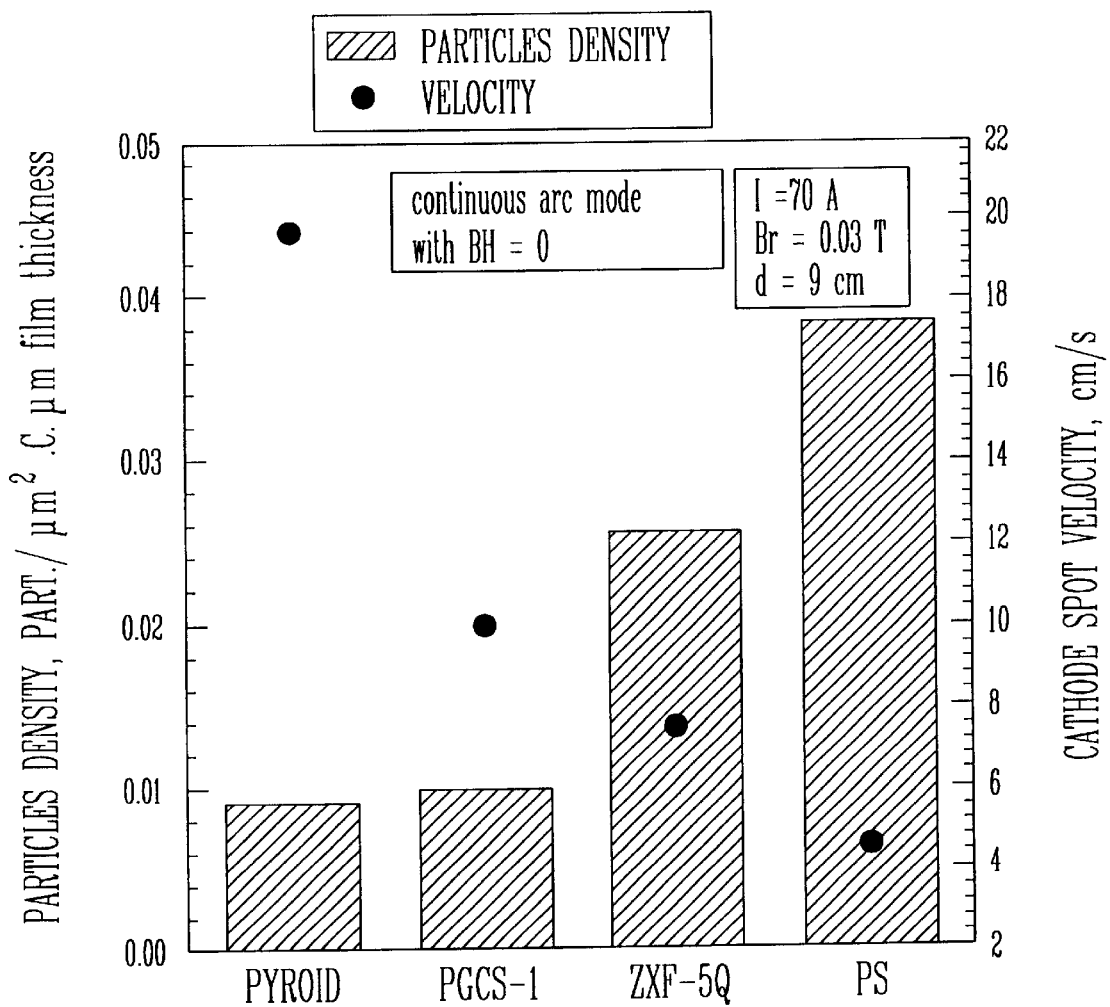
FIG. 4 illustrates the variation of carbon particle density and velocity for graphite target surfaces of different morphology in the absence of second magnetic filed.

With further reference to FIG. 4, there is illustrated the effect of the type of graphite on the number density of emitted particles (columns, left axis) when no Helmholtz field is applied, normalized to the deposited film thickness over silicon wafer substrates located at a short distance of d=9 cm, arc time of t=90 seconds and Br=0.03 T. The corresponding arc velocities for the same materials are also given (dots, right axis). No particles could be detected in the diamondlike coatings made under optimal conditions of Br=0.14.T, pyroid graphite cathode and typical deposition distance of d=52 cm.

Figure 5:
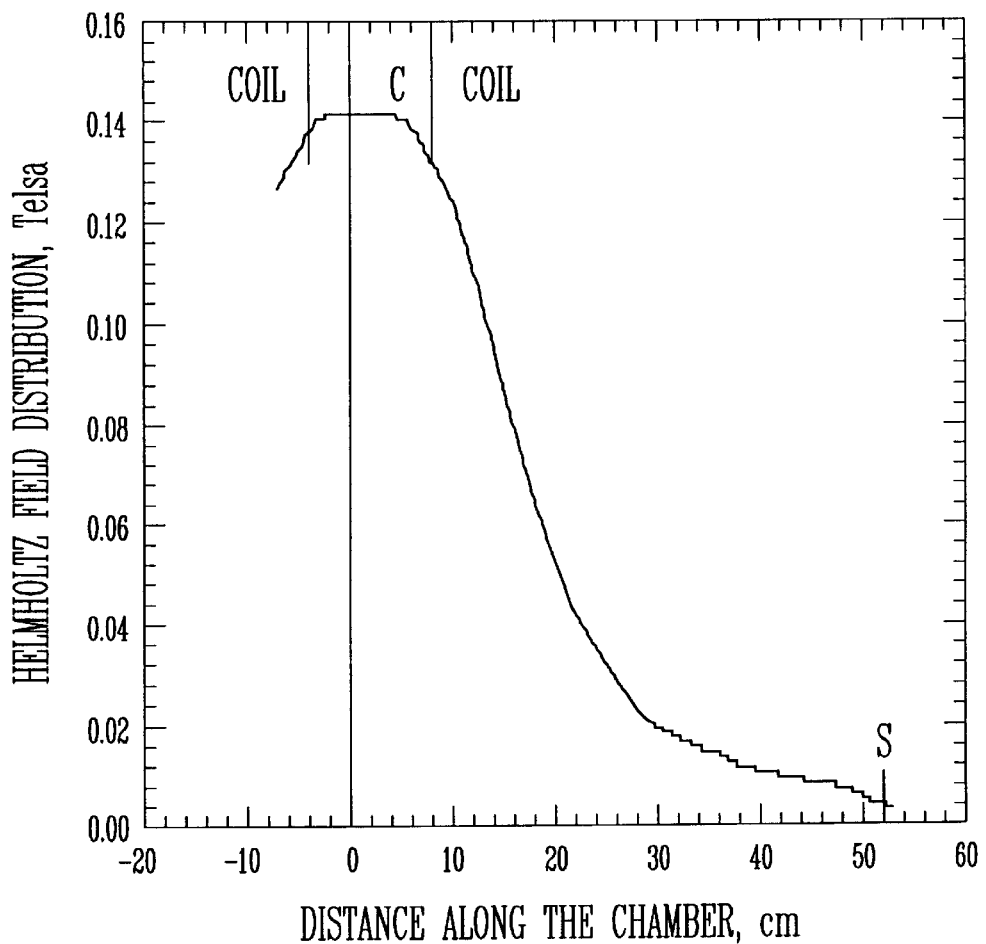
FIG. 5 illustrates the effect of the second magnetic field.

With further reference to FIG. 5 there is shown the axial magnetic field intensity distribution generated by the Helmholts coil along the central axis of the deposition chamber. The cathode surface position (0 cm) is indicated by the letter C and correspond to the zone of highest axial magnetic field intensity.

Figure 6:
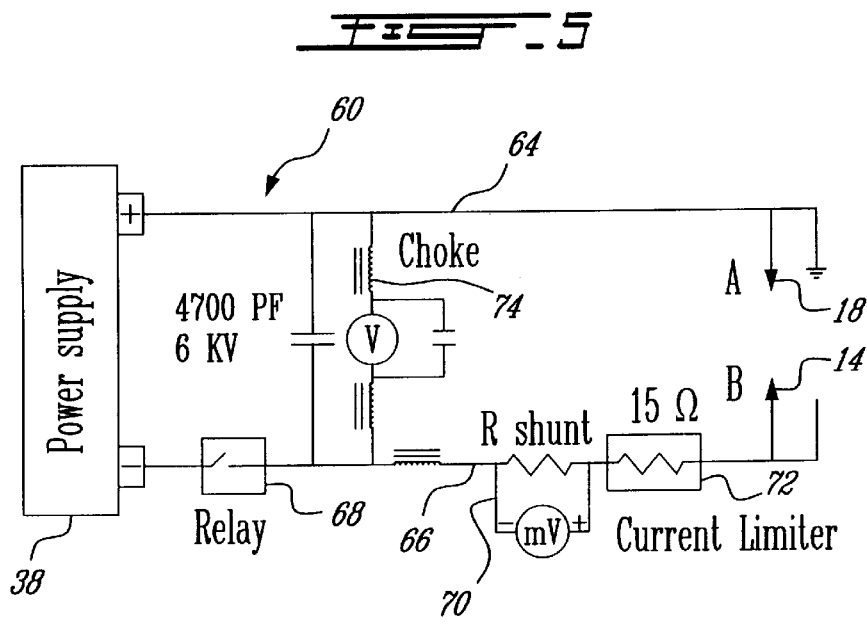
FIG. 6 illustrates schematically an electric circuit used in development of a continuous arc for the apparatus of FIG. 1.

With further reference to FIG. 6 an electric circuit 60 includes a power supply 62 with connection 64 to anode 18 (shown schematically) and connection 66 to cathode 14 (shown schematically).

A relay 68, shunt 70 and current limiter 72 are included in connection 66 and a choke 74 is connected between connections 64 and 66.

The present invention thus involves a "physical vapor deposition" technique characterized by very high adherence and hardness of the coatings produced. Diamondlike pushes these to even higher values with the added advantage of practically the highest thermal conductivity very low thermal expansion, very low friction coefficient (similar to Teflon). Application of diamond-like films such as the coating of computer hard disks and coating of optical devices are already common. Examples of possible uses of the coatings produced by the invention include the following areas: wear resistant coatings; decrease of friction between moving parts; cutting tools; biomedical and applications; chemical attack resistance; optics.

Many processes can produce diamond-like. Reports have indicated, however, that the Arc Ion Plating (AIP) process (also called Cathodic Arc Plasma Deposition (CAPD) or Vacuum Arc Deposition (VAD)) typically induces superior film quality. It is a process extensively used in industry for advanced ceramic films because of its relative ease and simplicity of operation. For example, biological implants, drill bits, watch bands or automotive parts are nowadays supplied to coating companies to produce the finishing titanium nitride coating.

Concerning "arc mobility" and "Mobility of the cathode spots" employed herein, these refer to the same phenomena. An electric arc in vacuum or low pressure shows a very diffuse structure between the electrodes, in other words there is no "arc column" as observed at atmospheric pressure. The only concentrated zones are the very hot "spots" (~10–100 μm typically) on the cathode surface. Arc mobility refers to the mobility of these hot spots on the cathode, these spots being the origin of the electron emission and ion beam emission producing the coating.

Concerning the magnetic field and the coil that are used to generate this magnetic field. The emissive surface of the cathode target is inserted inside the magnet field with its surface perpendicular to the magnetic field lines. The location of the emissive surface is such that the plasma flux emitted lies in the strongest axial magnetic field imposed. A set of two coils 26 and 28 (FIG. 1) may be used to generate this magnetic field. The coils are arranged in a Helmholtz geometry, meaning they generate a relatively constant magnetic field value between them along the central axis of the discharge. For practical reasons the coils may be placed outside the vacuum chamber. Similarly, the magnetic system could have been designed and placed inside the vacuum chamber, or made without the Helmholtz arrangement using only one coil.

The important parameter here is not the coil geometry but the additional magnetic field that enhances the plasma confinement by eliminating the radial losses towards the walls. Such losses are strongly enhanced by the first magnetic field geometry induced by the magnets behind the target (generating radial field lines on the target surface that guide the plasma flux in a radial direction). The confinement of this radial flux enhances the plasma pressure at the spot and forces an increase of the Nottingham cooling of the spot surface and a decrease of the heat deposited by conduction in the material (see FIG. 2).

REFERENCE

S. Coulombe and J. -L. Meunier, Arc-cold cathode interactions: parametric dependence on local pressure, Plasma Sources Science and Technology, 6, pp. 508–517, 1997.

We claim:

1. A method for vacuum arc deposition of carbon on a substrate comprising:

establishing an electric arc between an anode and a cathode in a chamber under vacuum, said cathode having a target surface of non-porous graphite, emitting a plasma of carbon ions from said target surface, depositing said carbon ions on a substrate as an amorphous carbon coating, and maintaining an elevated local plasma pressure at said target surface effective to minimize the role of heat conduction in said target surface and formation of liquid droplets of carbon, and to promote electron emission cooling effects.

2. A method according to claim 1, wherein said substrate is in opposed, spaced apart, facing relationship with said target surface.

3. A method according to claim 2, further comprising applying a first magnetic field to bring the electric arc into rotation at a radial position corresponding to a zero field component in a direction perpendicular to said target surface.

4. A method according to claim 3, wherein said first magnetic field is developed by first magnetic field means disposed adjacent said cathode, such that said cathode is disposed intermediate said anode and said first magnetic field means, and intermediate said substrate and said first magnetic field means.

5. A method according to claim 3, further comprising applying a second magnetic field to establish a magnetic field component perpendicular to said target surface, said field component having a maximum at said target surface and decreasing to zero with increasing perpendicular distance from said target surface.

6. A method according to claim 5, wherein said second magnetic field is developed by second magnetic field means disposed radially outwardly of said target surface.

7. A method according to claim 1, wherein said non-porous graphite is a pyrolytic graphite made in a high temperature vacuum furnace by chemical vapor deposition from a hydrocarbon gas.

8. An apparatus for vacuum arc deposition of carbon on a substrate comprising:

a chamber, vacuum means adapted to establish a vacuum in said chamber, a cathode and an anode in spaced apart relationship and means to establish an electric arc between said cathode and said anode, said cathode having a target surface of non-porous graphite, means for supporting a substrate in said chamber for deposition of carbon ions from a plasma developed at said target surface by said electric arc, and means for maintaining an elevated local plasma pressure at said target surface effective to limit heat conduction effects in said target surface and formation of liquid droplets of carbon.

9. An apparatus according to claim 8, wherein said means for supporting a substrate is adapted to support the substrate in opposed, spaced apart, facing relationship with said target surface.

10. An apparatus according to claim 9, including a first magnetic field means adapted to develop a first magnetic field to bring the electric arc into rotation at a radial position corresponding to a zero field component in a direction perpendicular to said target surface.

11. An apparatus according to claim 10, wherein said first magnetic field means is disposed adjacent said cathode, such that said cathode is disposed intermediate said anode and said first magnetic field means, and intermediate said means for supporting a substrate and said first magnetic field means.

12. An apparatus according to claim 11, including a second magnetic field means disposed to establish a magnetic field component perpendicular to said target surface, said field component having a maximum at said target surface and decreasing to zero with increasing perpendicular distance from said target surface.

* * * * *